United States Patent
Molson et al.

(10) Patent No.: US 7,318,014 B1
(45) Date of Patent: Jan. 8, 2008

(54) BIT ACCURATE HARDWARE SIMULATION IN SYSTEM LEVEL SIMULATORS

(75) Inventors: Philippe Molson, San Jose, CA (US); Tony San, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 872 days.

(21) Appl. No.: 10/160,142

(22) Filed: May 31, 2002

(51) Int. Cl.
*G06F 17/50* (2006.01)
*G06F 7/38* (2006.01)

(52) U.S. Cl. .................. 703/13; 703/14; 712/224; 712/225; 712/226; 712/227; 716/1; 716/7; 716/8

(58) Field of Classification Search .............. 703/14, 703/26, 13; 712/226, 221, 222, 224, 225, 712/227; 716/1, 7, 8
See application file for complete search history.

(56) References Cited

U.S. PATENT DOCUMENTS

| | | | |
|---|---|---|---|
| 5,204,829 A * | 4/1993 | Lyu et al. ................ 708/508 |
| 5,452,239 A | 9/1995 | Dai et al. |
| 5,544,067 A | 8/1996 | Rostoker et al. |
| 5,848,262 A * | 12/1998 | Burch ..................... 703/13 |
| 6,053,947 A * | 4/2000 | Parson .................... 703/14 |
| 6,067,650 A | 5/2000 | Beausang et al. |
| 6,086,624 A * | 7/2000 | Murata ................... 703/26 |
| 6,152,612 A | 11/2000 | Liao et al. |
| 6,182,247 B1 | 1/2001 | Herrmann et al. |
| 6,247,147 B1 | 6/2001 | Beenstra et al. |
| 6,247,165 B1 | 6/2001 | Wohl et al. |
| 6,286,114 B1 | 9/2001 | Veenstra et al. |
| 6,425,116 B1 * | 7/2002 | Duboc et al. ............. 716/18 |
| 6,530,073 B2 | 3/2003 | Morgan |
| 6,539,536 B1 | 3/2003 | Singh et al. |
| 6,606,532 B1 * | 8/2003 | Yasuura et al. ........... 700/117 |
| 6,606,588 B1 * | 8/2003 | Schaumont et al. ........ 703/15 |
| 6,687,662 B1 * | 2/2004 | McNamara et al. ........ 703/14 |
| 6,842,888 B2 | 1/2005 | Roberts |
| 6,862,563 B1 * | 3/2005 | Hakewill et al. ........... 703/14 |

(Continued)

OTHER PUBLICATIONS

Per Holmberg, and Anne Mascarin, The MethWorks and Xilinx take FPGAs into Mainstream DSP,New Technologies DSP, Feb. 2001, pp. 14-15.*

(Continued)

*Primary Examiner*—Hugh Jones
*Assistant Examiner*—Kibrom K. Gebresilassie
(74) *Attorney, Agent, or Firm*—Beyer Weaver LLP

(57) ABSTRACT

A complete hardware design environment is available through a system level simulator. This hardware design environment provides a bit accurate simulator for carrying out hardware simulations in the system level simulator. These simulations take advantage of the computational capabilities of the simulation processor. To take advantage of the simulation processor's resources (e.g., certain FPU components), the signals used in the simulation are made to conform to the native word type of the simulation processor. The hardware blocks deployed in a design frequently use non-native (from the simulation processor's perspective) word types. The bit accurate simulator casts words (signals) defined in the hardware design from a non-native format to a multi-bit native format suitable for use by the simulation processor. At various stages in the simulation, the simulator checks the "value" of the signal to determine whether that value is allowed by a word format specified by the hardware design.

38 Claims, 15 Drawing Sheets

U.S. PATENT DOCUMENTS

| | | | |
|---|---|---|---|
| 6,883,147 B1* | 4/2005 | Ballagh et al. | 716/1 |
| 7,020,854 B2* | 3/2006 | Killian et al. | 716/1 |
| 7,085,702 B1* | 8/2006 | Hwang et al. | 703/15 |
| 7,107,567 B1* | 9/2006 | LeBlanc | 716/17 |
| 7,110,935 B1* | 9/2006 | Hwang et al. | 703/20 |
| 2002/0049944 A1* | 4/2002 | Lagoon et al. | 714/738 |
| 2003/0008684 A1* | 1/2003 | Ferris | 455/561 |
| 2003/0033374 A1* | 2/2003 | Horn et al. | 709/217 |
| 2003/0088710 A1* | 5/2003 | Sandhu et al. | 709/321 |
| 2003/0118081 A1* | 6/2003 | Philips et al. | 375/130 |
| 2003/0154465 A1* | 8/2003 | Bollano et al. | 717/137 |
| 2005/0065990 A1* | 3/2005 | Allen | 708/495 |
| 2005/0143968 A9* | 6/2005 | Odom et al. | 703/21 |
| 2005/0166038 A1* | 7/2005 | Wang et al. | 712/226 |
| 2006/0117274 A1* | 6/2006 | Tseng et al. | 716/1 |

OTHER PUBLICATIONS

Christian Kreiner, Christian Steger, Egon Teiniker, and Reinhold Weiss, A novel Codesign Approach based on Distributed Virtual Machines, Institute for Technical Informatics, Mar. 2002.*

Darin Chin, Implementing DSP Designs with the Xilinx System Generator and Implementation Tools, Jun. 2001, Syndicated, vol. 1, Issue 2, pp. 1-2.*

Gerard Vink, "Programming DSPs using C: efficiency and portability trade-offs"; Embedded system Nay 2000, pp. 19-30.*

S. Mahlke, R. Ravindran, M. Schlansker, R. Schreiber, and T. Sherwood, "Bitwidth Cognizant Architecture Synthesis of Custom Hardware Accelerators" 5th International Workshop on Software and Compilers for Embedded Systems, Mar. 2001 IEEE, total pages of 43.*

S. Mahlke, R. Ravindran, M. Schlansker, R. Schreiber, and T. Sherwood, "Bitwidth Cognizant Architecture Synthesis of Custom Hardware Accelerators", herein referred as Sherwood, 5th International Workshop on Software, and Compilers for Embedded Systems, Mar. 2001 IEEE, total pages of 43.*

S. Mahlke, R. Ravindran, M. Schlansker, R. Schreiber, and T. Sherwood, "Bitwidth Cognizant Architecture Synthesis of Custom Hardware Accelerators", herein referred as Mahlke, 5th International Workshop on Software and Compilers for Embedded Systems, Mar. 2001 IEEE.*

K. Wakabayashi, T. Okamoto, C-Based SoC Design Flow and EDA Tools: An ASIC and System Vendor Perspective, 2000 IEEE.*

Description of DSP design from the MathWorks website (www.mathworks.com/products/dsp-comm/topdown.shtml); available prior to May 31, 2002.

Description of Xilinx System Generator for Simulink; Product and Description available prior to May 31, 2002.

Description of DSP Builder product available from Altera Corporation; description appears at www.altera.com/products/software/system/dsp/dsp-builder.html; available prior to May 31, 2002.

Altera DSP Builder User Guide; available prior to May 31, 2002.

Simulink Fixed-Point Blockset, User's Guide, Version 3; Product and Description available prior to May 31, 2002.

IEEE 100, The Authoritative Dictionary of IEEE Standards Terms, 7th Ed. © 2000. p. 915.

Ha, Dong, "Simulation Graphical Environment User's Guide Using the VHDL Interface," last updated Oct. 1, 1998, http://www.e.vt.edu/~ha/cadtools/synopsys/sge_tutorial/tutorial.html.

"Synopsys® SourceModel User's Manual for VHDL," Apr. 1999, pp. 1-15 and 95-106.

"Dong S. Ha, Professor," printed Jun. 15, 2006, http://www.ee.vt.edu/ha.

Xilinx® "ChipScope Pro Software and Cores User Manual," Apr. 10, 2002.

Vink, "Programming DSPs using C: efficiency and portability trade-offs," Embedded Systems, May 2000, pp. 19-30. (#9).

Mahlke et al., "Bitwidth Cognizant Architecture Synthesis of Custom Hardware Accelerators," 5th International Workshop on Software and Compilers for Embedded Systems, Mar. 2001 IEEE, total pages of 43. (#10).

Simulink Fixed-Point Blockset, User's Guide, Version 3; Product and Description available prior to May 31, 2002. (#11).

Office Actions dated Mar. 3, 2006 and Aug. 24, 2006; U.S. Appl. No. 10/458,516, filed Jun. 9, 2003.

Office Action dated Jul. 5, 2006; U.S. Appl. No. 10/405,836, filed Apr. 1, 2003.

S. Mahlke, R. Ravindran, M. Schlansker, R. Schreiber, and T. Sherwood, "Bitwidth Cognizant Architecture Synthesis of Custom Hardware Accelerators", herein referred as Sherwood, 5th International Workshop on Software and Compilers for Embedded Systems, Mar. 2001 IEEE, total pages of 43.

Per Holmberg, and Anne Mascarin, "The MethWorks and Xilnx take FPGAs into Mainstream DSP", New Technologies DSP, Feb. 2001, pp. 14-15.

Christian Kreiner, Christian Steger, Egon Teiniker, and Reinhold Weiss, "A Novel Codesign Approach based on Distributed Virtual Machines", Institute for Technical Informatics, Mar. 2002.

Darin Chin, "Implementing DSP Designs with the Xilnx System Generator and Implementation Tools", Jun. 2001, Syndicated, vol. 1, Issue 2, pp. 1-2.

Xilnx® "ChipScope Pro Software and Cores User Manual", Apr. 10, 2002.

"Simulink: Dynamic System Simulation for MATLAB®" Version 3. Jan. 1999.

"Formal Verification Flow for Xilinx Devices Using the Synplify Pro® Software and the Conformal™ LEC Tool", Mar. 2003. http://www.synplicity.com/literature/pdf/formal_verificat4ion_final.pdf.

* cited by examiner 51 (Input Value - Decimal)
(11 00 11)

Normal Floating Point Representation

| 100110... | | ...0101 |
| mantissa | | exponent |

Cast to Fixed point Representation

| ...00110011 | | ...00 |
| mantissa | | exponent |

Figure 3B

[4].[4] Signed Binary Fractional notation
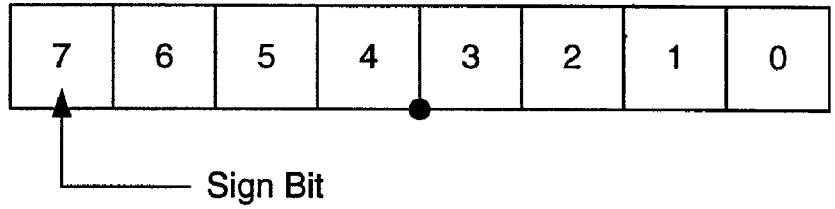
└──── Sign Bit
8-Bit Signed Integer
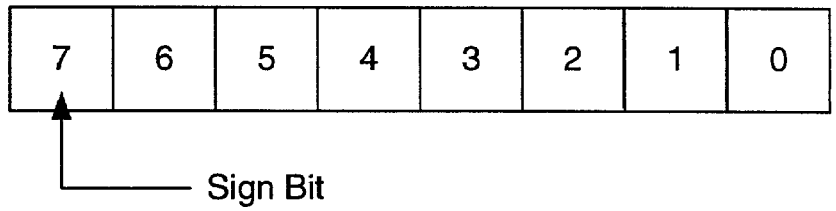
└──── Sign Bit
8-Bit Unsigned Integer
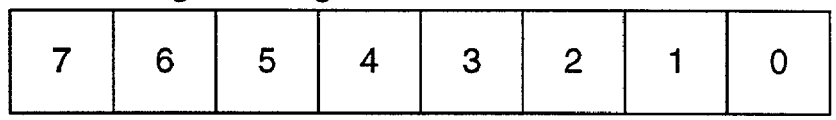
Figure 3C
| Floating-Point Numbers Cast to SBF ||||
|---|---|---|---|
| Bus Notation | Input | Syst. Level Sim. | VHDL |
| [5].[0] | 4/3 | 1 | 1 |
| [2].[3] | 4/3 | 1.25 | 10 |
| [1].[4] | 4/3 | -0.6875 | -11 |
Figure 3D

US 7,318,014 B1

BIT ACCURATE HARDWARE SIMULATION IN SYSTEM LEVEL SIMULATORS

BACKGROUND

The present invention relates to methods and apparatus for designing and developing digital signal processing hardware. More specifically, the present invention relates to methods and apparatus for using a system level simulator to generate and simulate hardware designs implementing particular algorithms designed in the system level simulator application.

Simulink® (available from The MathWorks, Inc. of Natick, Mass.) and similar system level simulators allow users to design and simulate Digital Signal Processors. The users design DSP algorithms in these simulators by entering logic blocks and associated connections in a graphical user interface window representing the overall design. System level simulators were traditionally limited to the algorithm development stage of DSP design. As originally implemented, these tools did not handle hardware constraints such as register size, bit width of various words, and the like. Yet logic and arithmetic elements of DSPs are typically implemented as fixed point processing elements employing relatively small word sizes. This is the only cost effective way to create high performance hardware.

Traditional simulators simulate a user's algorithm by executing logic block functions using a full floating-point numeric representation, having a very large dynamic range. Obviously, these simulations will not produce bit and cycle accurate results for the specific hardware design.

Hence, in the traditional scenario, hardware developers were forced to reenter an algorithm design that they had developed in a system level simulator into a hardware design tool such as an HDL based product. Only in this way could the developer obtain an accurate simulation and verification of his or her hardware design. Obviously, the reentry of a previously developed design, which may have been optimized on a full floating point algorithm development tool, was inefficient.

Recently, some products have been introduced to allow some level of hardware development in a system level simulator (specifically Simulink). In these tools, the user can impose some hardware constraints to get a better simulation of the hardware. Examples of such tools include the "System Generator for Simulink" available from Xilinx, Inc. of San Jose, Calif. and the Simulink RTW tools available from The MathWorks, Inc.

Unfortunately, problems remain with these products. First, these products cannot be used to fully design, compile and program the hardware. Second, these products do not allow the designer to introduce floorplan constraints (e.g., pin in and pin out designations, constraints on locations of particular logic or memory elements in the hardware target device, etc.). Still further, these products provide only a very slow simulation of the hardware design itself. This is because they use a bit-by-bit model to generate bit accurate simulations of non-native format words.

SUMMARY

The present invention addresses these problems by providing a complete hardware design environment available to designers via a system level simulator. This hardware design environment allows designers to directly enter floorplan constraints into hardware blocks that comprise a hardware design created within the system level simulator. It also allows designers to program compiled hardware designs directly from the system level simulator, without launching a separate application.

Further, an important aspect of the invention pertains to bit accurate simulations carried out by the system level simulator. These simulations take full advantage of the computational capabilities of the simulation processor, e.g., a general purpose Pentium® or UltraSPARC® processor. Therefore, they can be conducted rapidly and accurately. To take advantage of the simulation processor's resources (e.g., certain Floating Point Unit (FPU) components), the signals used in the simulation should conform to the native word type of the simulation processor resource. Often this native word type is floating point. Of course, the hardware blocks deployed in a design frequently use non-native (from the simulation processor's perspective) word types. The invention casts words (signals) defined for the hardware design from a non-native format to a multi-bit native format suitable for use by the simulation processor. For example an 8 bit integer (hardware design format) may be cast into a 64 bit floating point word (simulation processor native format). The 8 bit value is preserved within the floating point word, which is processed efficiently by the simulation processor.

Of course, the simulation processor may not preserve the hardware constrained word formats at every stage of the simulation. To address this issue, at various stages in the simulation (associated with connections between individual hardware blocks), the simulator checks the "value" of the floating point word to determine whether that value is allowed by the word format specified for the current stage of the hardware design. For example, if the specified word format is a four bit signed integer, the value of the word must be a whole number between −8 and 7. If the simulator finds that the word value is not allowed, it constrains the value to fall within the range of values allowed by the hardware design. Note that this checking and constraining is performed only on the "value" of the word. The word generally remains in the multi-bit native format required by the simulation processor.

One specific aspect of the invention pertains to a bit accurate simulator provided with a system level simulator. The bit accurate simulator may be characterized by program code for performing the following operations. First, the code provides a representation of a hardware design in the system level simulator. Within the hardware design, there are hardware blocks employing word formats, which are a non-native word format for a simulation processor. For a frame of reference in this explanation, the hardware design has a first hardware block that has a first input and a "word format constraint" imposed on the first input. As part of the simulation, the simulator casts a simulation input signal to a multi-bit native format for the simulation processor. This input signal is subsequently processed by one or more hardware modules in the design. As part of the simulation, the code constrains the value of the first input (for the first hardware block)—while cast in the multi-bit native format—to meet the word format constraint imposed by the hardware design on the first word. Then, with the first input having a value meeting the word format constraint, the simulator performs an operation specified by the first hardware block. It performs the operation on the input word cast in the native format. This produces an output in the native format. The simulator may also constrain the value of the output—while cast in the native format—to produce an output word having a second word format specified in the hardware design. A similar process of constraining input word values, executing a function block, and constraining output word values is applied to the remaining blocks of the hardware design.

These and other features and advantages of the present invention will be described in more detail below, with reference to the appended drawings.

BRIEF DESCRIPTION OF THE DRAWINGS

FIG. 3B illustrates one example of a casting function in accordance with this invention.

FIG. 3C graphically compares the signed binary fractional, signed binary, and unsigned binary number formats.

FIG. 3D illustrates how a floating point number (4/3=1.3333) is cast into SBF format with 3 different binary point locations.

DETAILED DESCRIPTION

Introduction

Figure 1A:
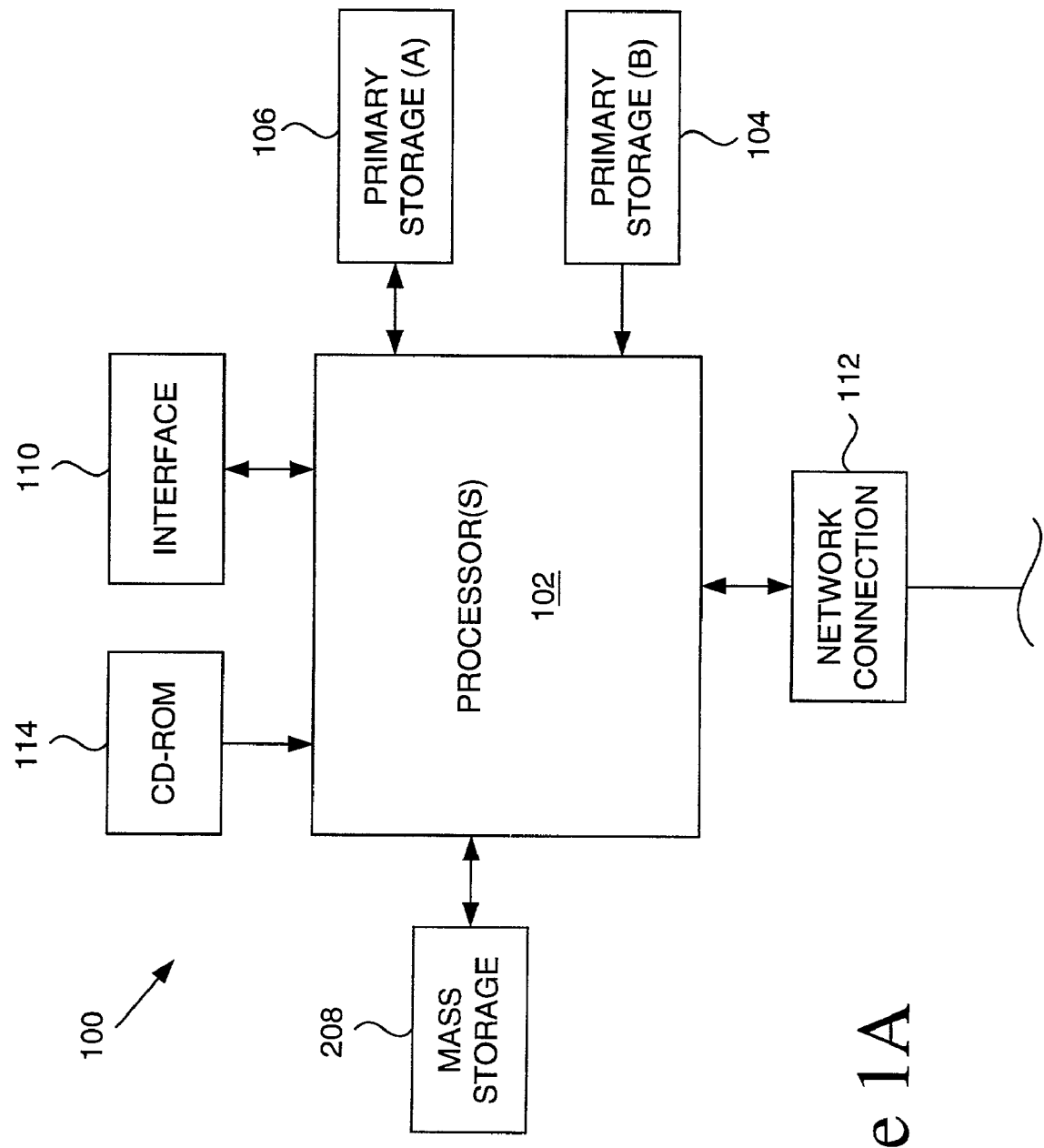
FIG. 1A illustrates a typical computer system that, when appropriately configured or designed, can serve as an apparatus of this invention.

The present invention pertains to system level simulators that accurately simulate hardware designs comprised of hardware blocks having input and output words of specified types and bit sizes. Often these words are fixed point values. The hardware simulations of this invention employ a particularly efficient hardware simulation algorithm that will be described in detail below. In some cases, the simulators of this invention also allow conventional system level simulation, where the function blocks are simulated independently of word format and size constraints imposed by the hardware.

Generally, the term "simulator" refers to programs that can dynamically execute an abstract design description. Given a description of the circuit and a model for how the elements of the description behave, the simulator maps an input stimulus into an output response, often as a function of time. Simulators exist for all levels of design description, from the most abstract behavioral level through the detailed transistor level.

"System level simulators" allow entry of abstract process blocks (modules) representing various stages in an algorithm. The blocks themselves are not intrinsically linked to any particular hardware. Hence, in traditional system level simulators, the various modules comprising a design are not constrained to particular word formats, and the simulators simulate the various process blocks employing a full floating point representation of the input and output signals.

The Simulink product available from The MathWorks, Inc. is a widely used system level simulator. Throughout this specification, Simulink is used as an example. However, this invention is not limited to Simulink or any other commercial or proprietary system level simulator. Further, the invention applies to both enhancements of existing simulator products (such as Simulink) and completely new simulator products designed from the ground up. Either way, the system level simulators of this invention preferably allow conventional algorithm design and simulation as well as hardware design and simulation. Generally, though not necessarily, system level simulators are implemented as software running on a general-purpose microprocessor. Simulink, for example, is a software application that can run on Intel Pentium® processors. And generally, though not necessarily, full floating point notation is the default representation of process blocks in system level simulators.

Hardware simulations should, to be worthwhile, provide results that are "cycle accurate" and "bit accurate." Bit accurate results correctly predict the bit values that each position in an output word of any given processing block within the design. Cycle accurate results provide a cycle-by-cycle representation of input and output values at any given block within the overall design. Note that bit and cycle accurate simulations analyze hardware designs by separately operating on each "primitive" (a basic functional block, module, or transformation) represented in the design.

Providing bit accurate simulation results can pose a particular challenge. Because DSP designs often employ words in "non-native" formats (e.g., an 11 bit fixed point format or other format that is not conventionally employed in microprocessors), standard processing resources available with an Intel Pentium or other general-purpose microprocessor cannot directly calculate bit accurate results. The relevant processing resources of such processors cannot directly handle words in non-native formats.

To address this issue, some cycle accurate simulators perform simulations by decomposing the multi-bit input words of hardware design elements into individual bits, which are separately analyzed. In essence, the simulation processor carries out the simulation of a hardware module on each bit, in succession. Hence, for an 8-bit input word, the simulator will conduct eight successive simulations, with each one considering an input, an output, a carry value (for arithmetic operations), and other parameters. This is obviously a rather slow process. Further, it makes no use of the multi-bit floating point logic available in the Pentium or other general purpose microprocessor used to carry out the simulation. Hence, the bit-by-bit simulation process is highly inefficient.

The simulators of this invention attack this problem by "casting" non-native format words from the hardware simulation into a word format (typically floating point) that can take advantage of the simulation processor's multi-bit processing resources. These resources operate on the whole input word, rather just one bit at a time. Thus, the simulation result for any hardware module is quickly calculated. The resulting output value from the processor is in the processor's native format. The input and output "values" represented in the native word format must conform to word format constraints imposed by the hardware design. For example, the hardware design requires that an input to a multiplier be a 4 bit unsigned integer, then the numerical "value" of the word presented to the multiplier during the simulation must be a whole number between 0 and 15. To this end, simulators of this invention constrain hardware module inputs and outputs to numerical values meeting the requirements on word formats imposed by the hardware designer.

Casting is a function available in C and some other programming languages. Generally, casts force an expression to be of a specific type. The general form of a cast operator in C is (type) expression, where type is a valid data type. For example, to make sure that the expression x/2 evaluates to type float, one would write (float) x/2. A further explanation of the application of casting to this invention will be presented below.

Sample code for casting a non-native word to a native word follows:

```
class SBuildBus {
    int BusType;
    int BitLeft;
    int BitRight;
    __int64 Sleft(int width)
    // Shift left a 64 bit number
    {
        __int64 sft(0);
        if (width<25)   sft(1<<width);
        else
        {
            int width__msb, width__lsb(24);
            width__msb = width-24;
            sft =           (1<<width__lsb) ;
            sft = sft *     (1<<width__msb);
        }
        return sft;
    }
    __int64 Usgn2Sgn(int width, __int64 nUnsigned)
    {
        __int64 maxnum = Sleft(width);
        __int64 maxpos = Sleft(width-1);
        if (nUnsigned>(maxnum-1) )   return 0;
        else
        {
            if (nUnsigned<maxpos) return nUnsigned;
            else return (nUnsigned-maxnum);
        }
    }
public:
    SBuildBus(int bt, int l,int r)
    {
        BusType     = bt;
        BitLeft     = l;
            BitRight    = r;
    }
    virtual ~SBuildBus( )
    // Destructor
    {
    }
    double GetBus(int *data)
    {
        double dtemp(0.0);
        __int64 AccumTemp(0);
        int width = BitLeft+BitRight;
        for (int i=0;i<width;i++)
        {
```

-continued

```
            __int64 si = Sleft(i);
            __int64    inctemp = (data[i]>0) ? si:0 ;
            AccumTemp += inctemp ;
        }
        __int64 SgAccumTemp= (BusType<3) ?Usgn2Sgn (width, AccumTemp):AccumTemp;
        double dSgAccumTemp = static__cast<double> (SgAccumTemp);
        __int64 sft = Sleft(BitRight);
        double dsft = static__cast<double>(sft);
        dtemp = dSgAccumTemp / dsft;
        return dtemp;
    }
};
```

The word formats of the hardware designs may be specified by various mechanisms. At some point in the design process, the user must specify word formats associated with input and output signals for one or more design blocks entered in the system level simulator. Generally, the parameters that can be specified by the user include the word type, the node type, and the number of bits. Examples of word types include signed integer, unsigned integer, single precision floating point, double precision floating point, single bit, and the like. Examples of nodes types include input ports, output ports, constants, and the like. In one case, the user specifies word formats by inputting parameterized blocks referenced in the design as "word format modules" (referenced in Altera's DSP Builder product as "AltBus"). These are inserted at appropriate locations in the system level design. During simulation, they effectively constrain the signals to values meeting the specified word format. Word format modules will be described in more detail below.

Apparatus and Environment

Generally, embodiments of the present invention employ processes involving data stored in or transferred through one or more computer systems. Embodiments of the present invention also relate to hardware devices or other apparatus for performing these operations. Such apparatus may be specially constructed serve as a simulator or design environment of this invention, or it may be a general-purpose computer selectively activated or reconfigured by a computer program and/or data structure stored in the computer. The processes presented herein are not inherently related to any particular computer or other apparatus. Suitable structures for these machines will be apparent to those of ordinary skill in the art based on the description given herein.

In addition, embodiments of the present invention relate to computer readable media or computer program products that include program instructions and/or data (including data structures) for performing various computer-implemented operations. Examples of computer-readable media include, but are not limited to, magnetic media such as hard disks, floppy disks, and magnetic tape; optical media such as CD-ROM disks; magneto-optical media; semiconductor memory devices, such as Flash, EPROM, and EEPROM memories, and hardware devices that are specially configured to store program instructions and data, such as read-only memory devices (ROM) and random access memory (RAM). The data and program instructions of this invention may also be embodied on a carrier wave or other transport medium. Examples of program instructions include both machine code, such as produced by a compiler, and files containing higher level code that may be executed by the computer using an interpreter.

FIG. 1A illustrates a typical computer system that, when appropriately configured or designed, can serve as an apparatus of this invention. The computer system 100 includes any number of processors 102 (also referred to as central processing units, or CPUs) that are coupled to storage devices including primary storage A 106 (typically a random access memory, or RAM) and primary storage B 104 (typically a read only memory, or ROM). CPU 102 may be of various types including microcontrollers and microprocessors such as programmable devices (e.g., CPLDs and FPGAs) and unprogrammable devices such as gate array ASICs or general purpose microprocessors. As is well known in the art, primary storage 104 acts to transfer data and instructions uni-directionally to the CPU and primary storage 106 is used typically to transfer data and instructions in a bi-directonal manner. Both of these primary storage devices may include any suitable computer-readable media such as those described above. A mass storage device 208 is also coupled bi-directionally to CPU 102 and provides additional data storage capacity and may include any of the computer-readable media described above. Mass storage device 108 may be used to store programs, data and the like and is typically a secondary storage medium such as a hard disk. It will be appreciated that the information retained within the mass storage device 208, may, in appropriate cases, be incorporated in standard fashion as part of primary storage 106 as virtual memory. A specific mass storage device such as a CD-ROM 114 may also pass data uni-directionally to the CPU.

CPU 102 also is coupled to an interface 110 that connects to one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 102 optionally may be coupled to an external device such as a database or a computer or telecommunications network using an external connection as shown generally at 112. With such a connection, it is contemplated that the CPU might receive information from the network, or might output information to the network in the course of performing the method steps described herein.

In one embodiment, a system such as computer system 100 used as an electronic design automation tool that provides a system level simulator with hardware simulation capabilities and, optionally, one or more of a synthesizer, a compiler, and a target device programmer. Information and programs, including configuration information files and other files can be provided via a network connection 112 for downloading by the designer. Alternatively, such information, programs and files can be provided to a designer on a storage device. The pertinent details associated with system level simulators are discussed in more detail below.

Figure 1B:
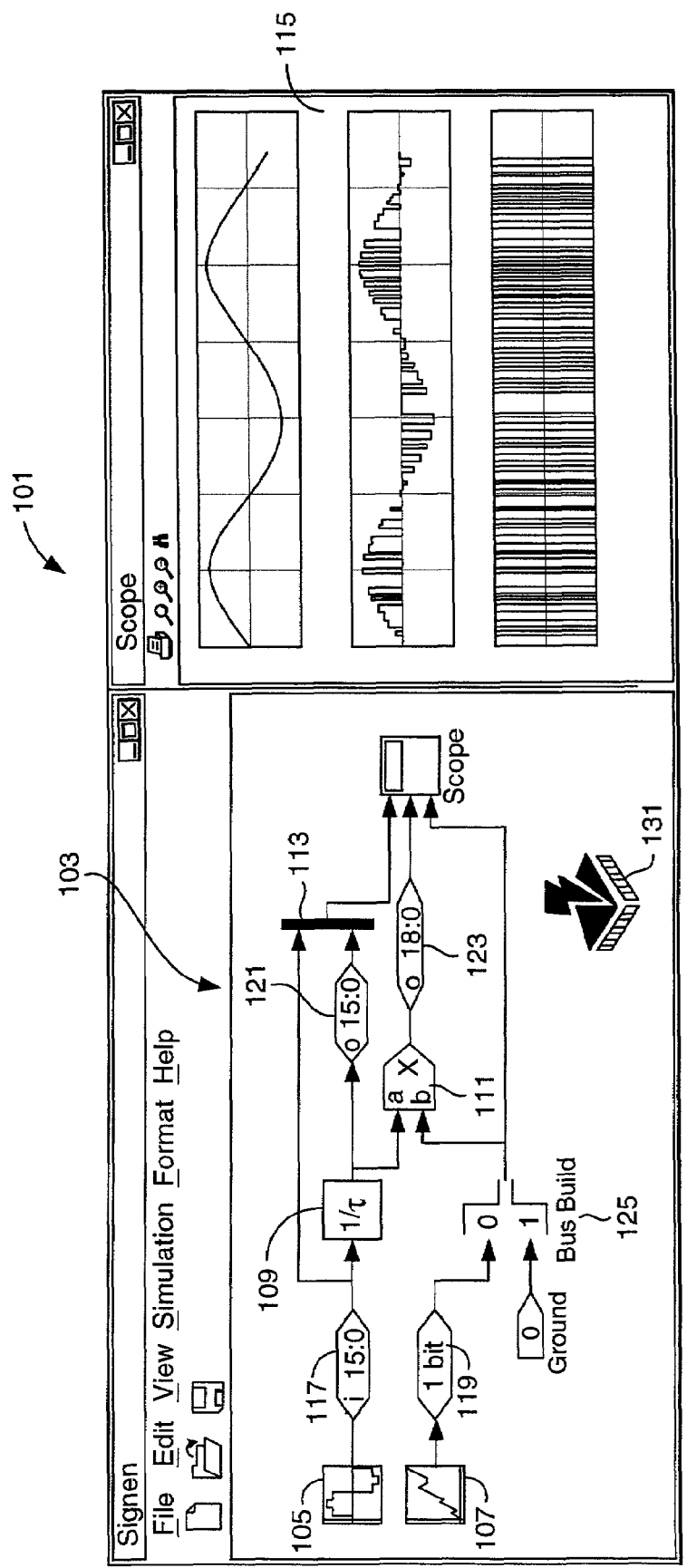
FIG. 1B presents a graphical user interface window (with a sample hardware design) for a system level simulator that makes use of the present invention.

FIG. 1B depicts an example of a hardware design entered in a system level simulator (Simulink in this example). In this simple example, the hardware design represents an amplitude modulation model. On the left hand side of a user interface window 101 (for the system level simulator) the user has input various blocks that together comprise the amplitude modulation model. A sine wave generator 105 and a random bit stream input 107 on the far left side provide the signal inputs. A delay module 109, a multiplier module 111, and a multiplexer module 113 perform the necessary signal manipulations. A scope block 115 on the right side of user interface window 101 presents simulation results for three signals of interest.

As shown, the hardware design includes four separate "word format modules" 117, 119, 121, and 123 (also identified as "AltBuses" herein) that specify a word type and a word size for certain of the signals appearing on the connections of the amplitude modulation model. As indicated, these word format modules constrain the design to particular word formats, which might otherwise be represented as double precision floating point values by the system level simulator. These word format modules therefore constrain the simulator to conduct its simulation using the words specified for the hardware design. A related module, bus build module 125, constructs a bus from bit inputs; ground and a random bitstream in this case.

The remainder of this document will describe how to enter the various modules comprising a hardware design in a system level simulator, how to constrain the word format associated with these modules, how to enter floorplan constraints in the various modules, how to conduct bit accurate and cycle accurate hardware simulations in the system level simulator, and how to compile and program a hardware design previously entered and simulated in the system level simulator.

Methodology

Figure 2A:
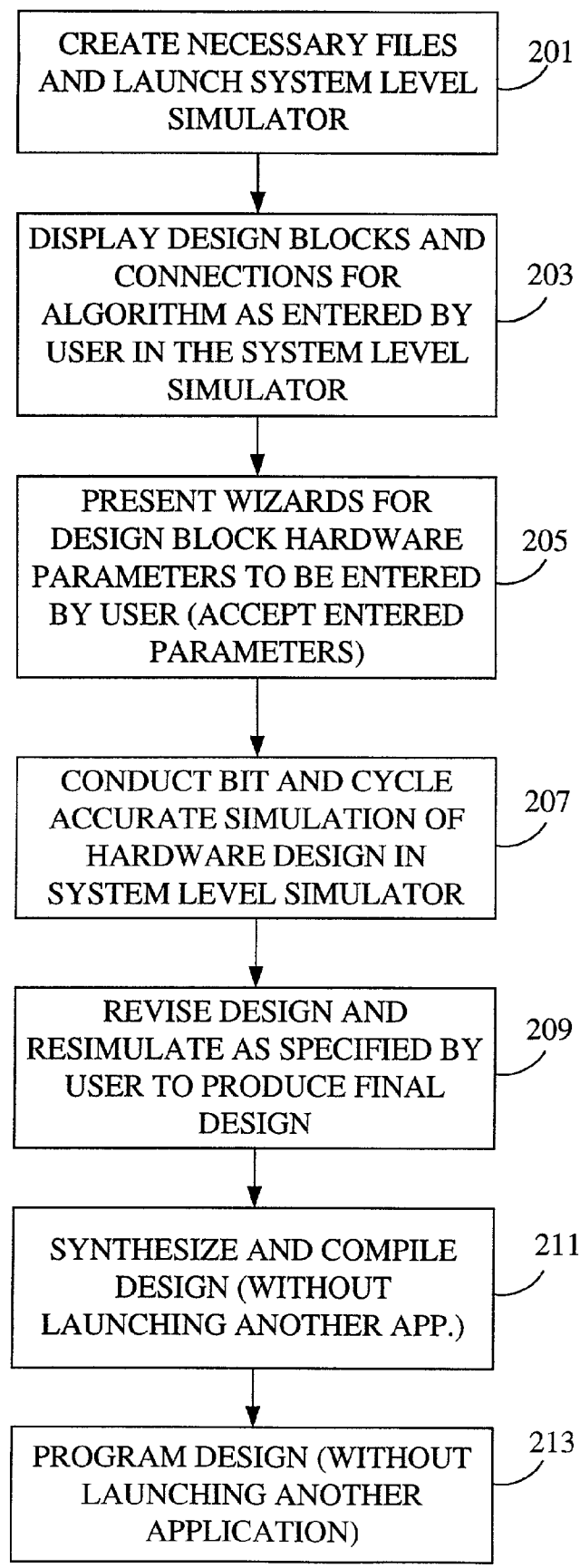
FIG. 2A is a process flow diagram of a typical sequence of operations performed by a system level simulator of this invention.
Figure 2B:
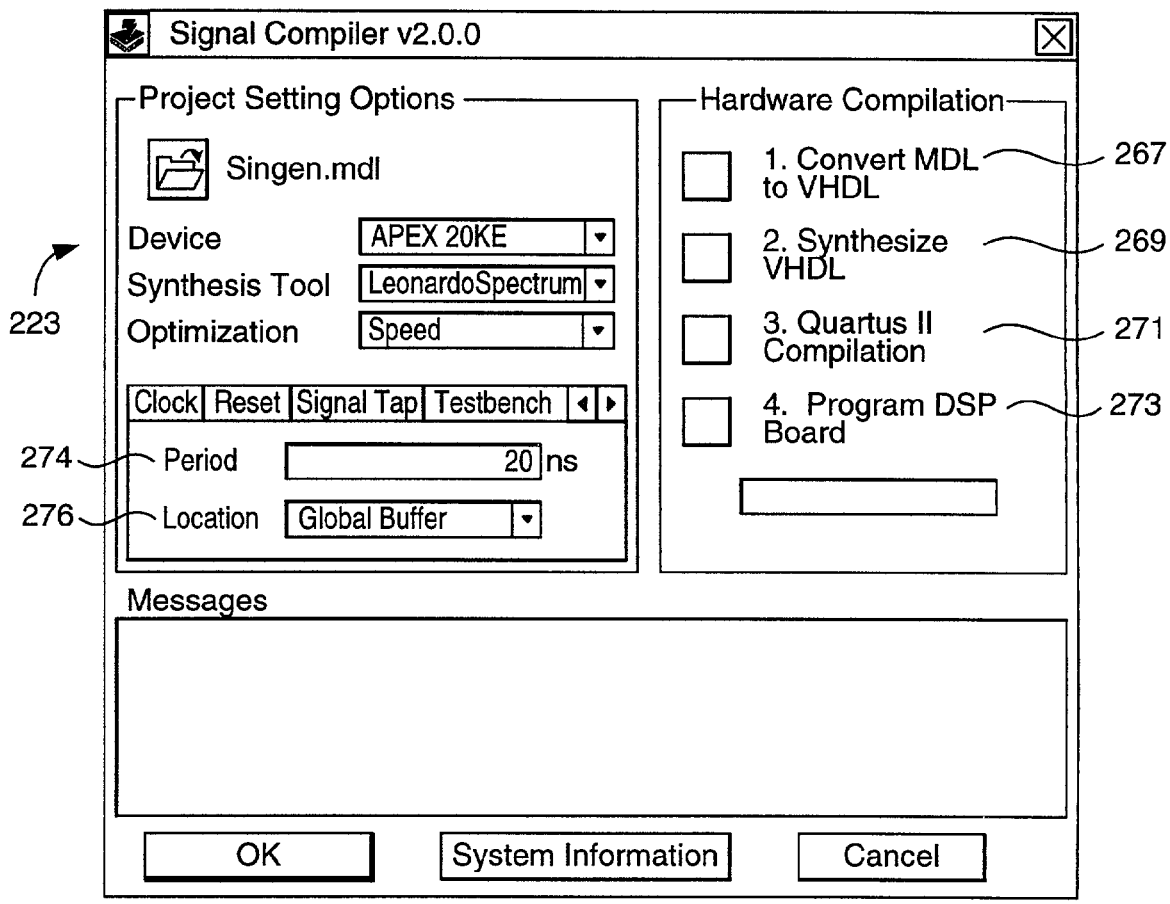
FIG. 2B is a screen shot of a "signal compiler" user interface.

FIG. 2A is a flow chart depicting various events that are sequentially encountered by a system level simulator of this invention during a typical design project. As depicted, the process begins at 201 with creation of one or more files for the hardware design, the simulation results, etc. In addition, at his stage, the system level simulator is launched. Still further, at this initial stage of the process flow, the user will typically enter a signal compiler block (although this is not necessary in all embodiments of the invention). The signal compiler block specifies various compiler settings employed when the finalized hardware design (as entered in the system level simulator) is actually compiled prior to programming on a target hardware device. FIG. 2B presents an example of a signal compiler block that may be used in accordance with this invention. As can be seen, it specifies a target hardware device type, a synthesis tool, and a general optimization goal such as speed or area. It also allows the user to specify various clock parameters. Some of these settings can impact the hardware design as parameterized and simulated in the system level simulator.

Returning to FIG. 2A, the next operation in the sequence, block 203, causes the system level simulator to display the design blocks and connections for the algorithm as entered by the user. Note that entry of the design blocks and connections is typically a gradual process with the user/designer entering one module at a time and then the connections therebetween. Logically, these design blocks or modules may be viewed as "primitives". They may be as simple as adders and accumulators or as complex as megafunctions and cores. The design blocks may be selected from a variety of sources available to the designer.

As indicated above, some of the "modules" in a hardware design of this invention are "word format modules" that specifies word formats (e.g., 8 bit integer or double precision floating point) for various signals. As with other hardware modules, the word format modules are entered by the user who selects, positions, and parameterizes the word format module as appropriate for the hardware design.

At block 205 in the process flow of FIG. 2A, the system level simulator presents "parameter interfaces" for the various primitives that comprise the hardware design. For more complicated functional blocks such as megafunctions, the parameter interfaces are sometimes referred to as "wizards." The parameter interfaces allow the user to parameterize the various design blocks of the hardware design depicted in the system level simulator. As part of this process, the parameter interfaces may receive user instructions for mapping particular logical components to particular hardware features on the target device. In other words, the user can enter "floorplan" constraints via the system level simulator. Examples of some design module parameter interfaces are shown in FIGS. 2D-2I, discussed below.

Next, at block 207, the system conducts a bit and cycle accurate simulation of the hardware design as entered and parameterized in the system level simulator. This process employs an efficient algorithm that makes use of multi-bit processing resources available in the simulation processor (e.g., a Pentium microprocessor or a SPARC microprocessor). Typically, floating point components of the processor's Floating Point Unit (FPU) resource are employed to conduct the simulation on words representing inputs and outputs to the hardware design modules. In one example, the results of the simulation may be displayed on a "scope" as depicted in the right hand side of user interface 101 depicted in FIG. 1B.

Next, in FIG. 2A, the system allows for user/designer revisions to the hardware design that may be entered in response to issues discovered during the simulation at 207. Thus, the system level simulator revises the design and resimulates it as specified by the user. See 209. This may be an iterative process requiring multiple incremental designs before arriving at the final design.

After the final design has been accepted at 209, the system may synthesize and compile a design in response to a user request. See 211. In one example, the signal compiler block depicted in FIG. 2B allows the user to control these operations. As shown there, the user interface allows the user to separately initiate (1) conversion of the design into a hardware design language, (2) synthesis of the HDL representation of the design, (3) compilation of the design, and finally (4) programming of the compile design on to a target hardware device. Block 213 in the process flow of FIG. 2A depicts the programming operation. Note that synthesizing, compiling, and programming can all be performed within the system level simulator application. The user need not launch a separate application to execute any of these other operations.

Some aspects of the FIG. 2A process will now be described in more detail. As indicated at blocks 203 and 205, designers input various functional blocks and connections for the algorithm they are implementing. As illustrated above, a designer creates an electronic design from various functional blocks. For example, the designer may first employ a functional block for a particular filter, then employ a functional block for a buffer, and then one for a memory block, and so on. With the component functional blocks in hand, the designer makes the necessary connections between them to create the larger design, a project.

So during the design process, a designer simply inserts a selected functional block into his or her hardware design, and makes the necessary connections to other features of the larger electronic design. The resulting hardware design includes the "off-the-shelf" functional blocks integrated with each other, and possibly other user-created components. This design can be then be simulated, compiled, and used to program a programmable logic device or layout an application specific integrated circuit (ASIC), for example.

The predefined off-the-shelf functional blocks have varying levels of complexity and are widely-used the EDA industry. Examples include megafunctions, cores, macrofunctions, and simpler functional blocks such as adders, multipliers, buffers, and multiplexers. For purposes of this invention, they are all referred to as functional blocks or hardware blocks and they are treated as primitives.

Figure 2C:
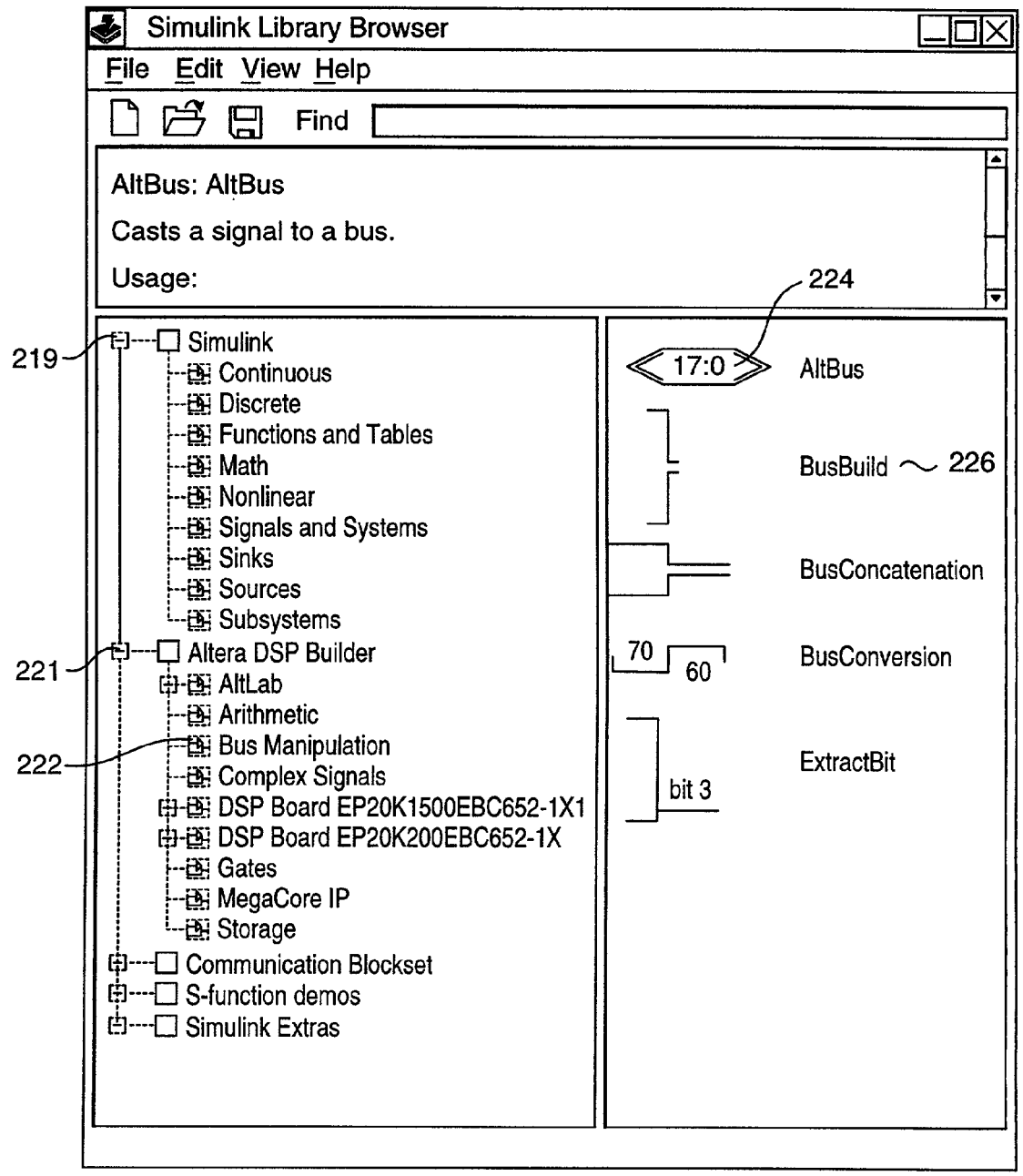
FIG. 2C is a screen shot of a browser displaying a directory of functions for use in creating a hardware design suitable for use with this invention.

FIG. 2C presents an example of a browser window 217 showing a directory of folders containing off-the-shelf functional blocks useful for creating hardware designs in accordance with this invention. As depicted, the directory includes a folder 219 containing functions available with the system level simulator. It contains another folder 221 containing various hardware blocks associated with a hardware design tool. During the design process, the designer selects various of the functions and blocks from these folders and inserts them in a system level simulator window such as window 101 shown in FIG. 1B.

As indicated in block 205 of FIG. 2A, the user may parameterize hardware modules of the hardware design. Parameterization may take place at a global design level or a local functional block level. As indicated above, the user specifies global design parameters via a signal compiler such as that depicted in FIG. 2B. These general design parameters allow the designer to specify a target hardware device and a general optimization goal. They also allow the designer to specify, for example, clock settings, reset settings, signal tap settings, and test bench settings. Generally, in accordance with a preferred embodiment of this invention, a single signal compiler block is provided for each hardware design (see icon 131 of FIG. 1B).

While a signal compiler window allows designers to specify global parameters, individual functional blocks have their own associated parameters that may be set separately from global parameters. The underlying design associated with an individual functional block is defined by various parameters. Examples include bus widths, buffer sizes, memory array dimensions, etc. Some functional blocks contain rigidly set values for the associated parameters. For example, a buffer functional block may require a buffer depth of 16 words and a buffer width of 32 bits. Functional blocks having such rigidly set specifications are frequently referred to as "non-parameterized" functional blocks.

Other functional blocks are "parameterized." Typically, these functional blocks take advantage of the ability of some Hardware Description Languages to encode parameters for which the user/developer can specify values. Collections or libraries of parameterized megafunctions or other functional blocks are available. One example is the library of parameterized modules ("LPM") developed under the guidance of the EDIF association. Examples of members of the library include adders, multipliers, comparators, etc. Generally, these functions are rather low level.

Parameter interfaces, including wizards, are provided for more complex design blocks to allow entry of hardware parameters. The use of wizards to parameterize functional blocks in electronic designs is well known. See for example, U.S. patent application Ser. No. 09/243,195, "METHOD OF GENERATING CUSTOMIZED, MEGAFUNCTIONS," filed Feb. 1, 1999 by Ahanessians and LeBlanc. A few examples of parameter interfaces for parameterizing hardware design blocks will now be presented.

Figure 2D:
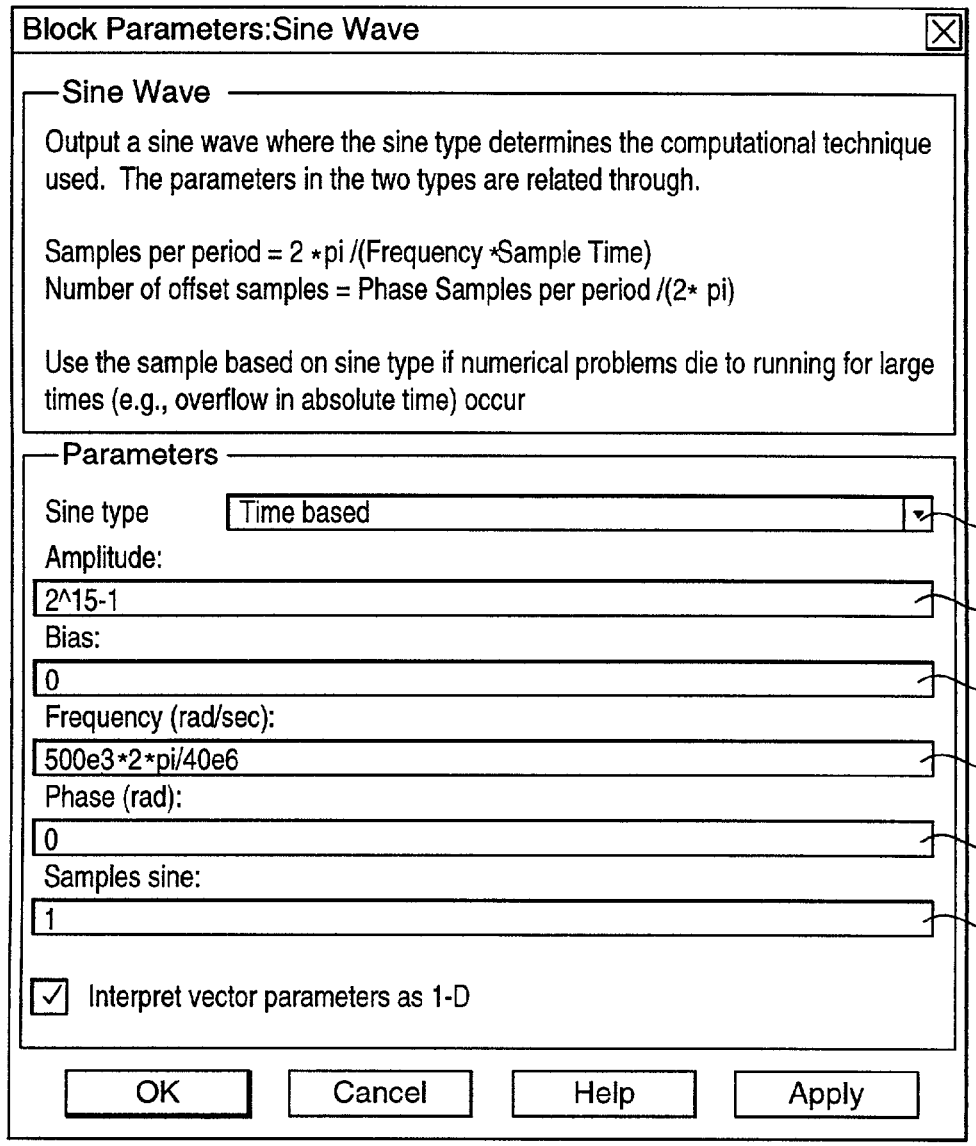
FIG. 2D is a screen shot of a window provided for parameterizing a sign wave generator block available to a designer creating a hardware design in accordance with an embodiment of this invention.

FIG. 2D presents a parameter interface 223 that allows a designer to enter parameters controlling a sine wave generator. This is but one example of a parameter interface for parameterizing specific functional blocks. As shown in this Figure, parameter interface 223 prompts the user to specify certain parameters necessary for operating the sine wave generator. These include a sine wave type 225 (options may include time-based and frequency-based), an amplitude 227, a bias 229, a frequency 231, a phase 233, and a sample time 235. Aside from the drop down menu associated with sine wave type 225, the parameters prompted by parameter interface 223 require that the user insert specific numeric values.

Figure 2E:
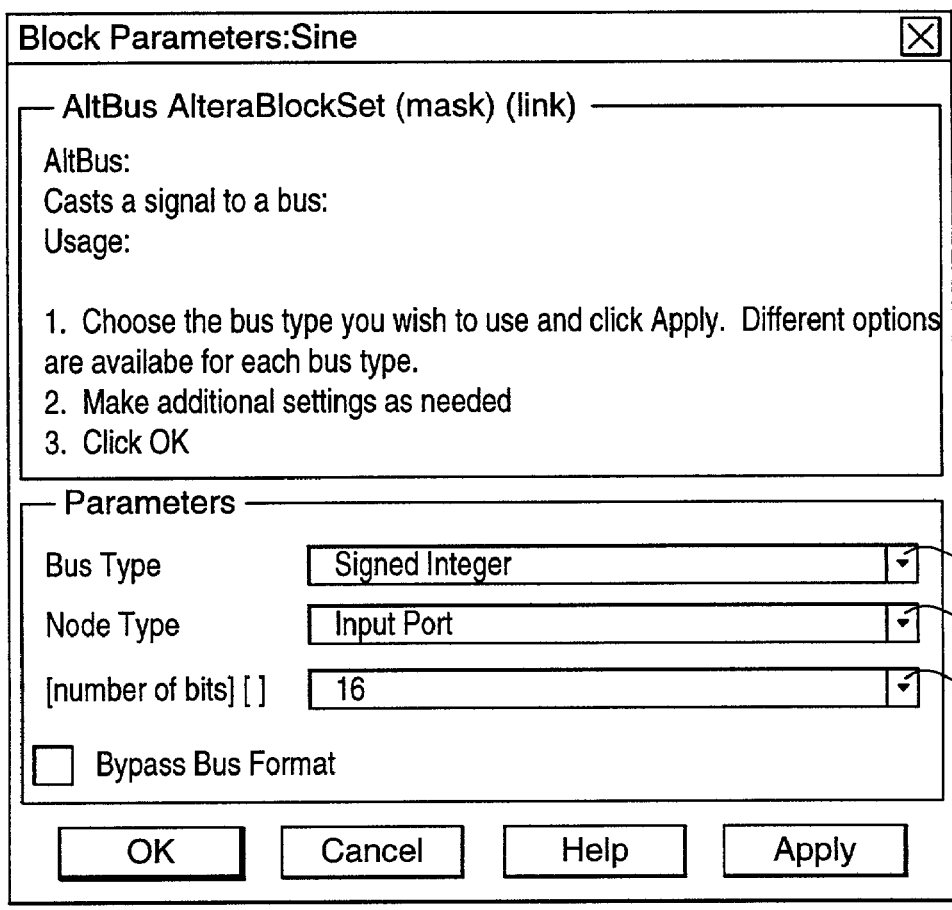
FIGS. 2E through 2H depict windows for specifying hardware word formats for inputs and outputs to the individual functional blocks comprising a hardware design created by a user in a system level simulator of this invention. The individual figures show different word format settings for busses in the hardware design.

FIG. 2E presents a parameter interface 237 for entering parameters defining the word format of signals from the sine wave generator 105 (and received at the input to delay block 109) of hardware design 101 shown in FIG. 1B. These parameters are applied as word format module 117 in FIG. 1B. As shown, this parameter interface specifies a word type 239, a node type 241, and a word size 243 (in bits), all selected by the designer. These constraints effectively limit the operation (simulation) of the system level simulator to operate on words used in the actual hardware design. This allows a bit accurate simulation by the system level simulator.

Figure 2F:
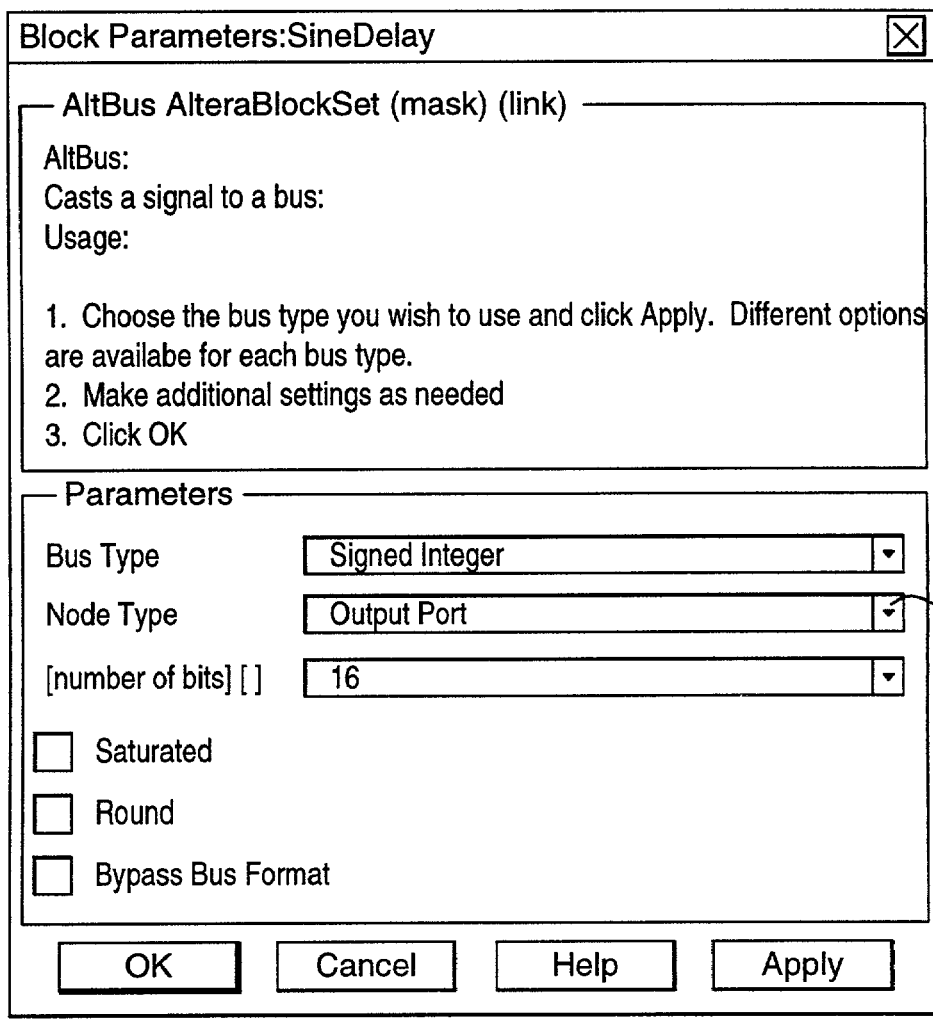
Figure 2G:
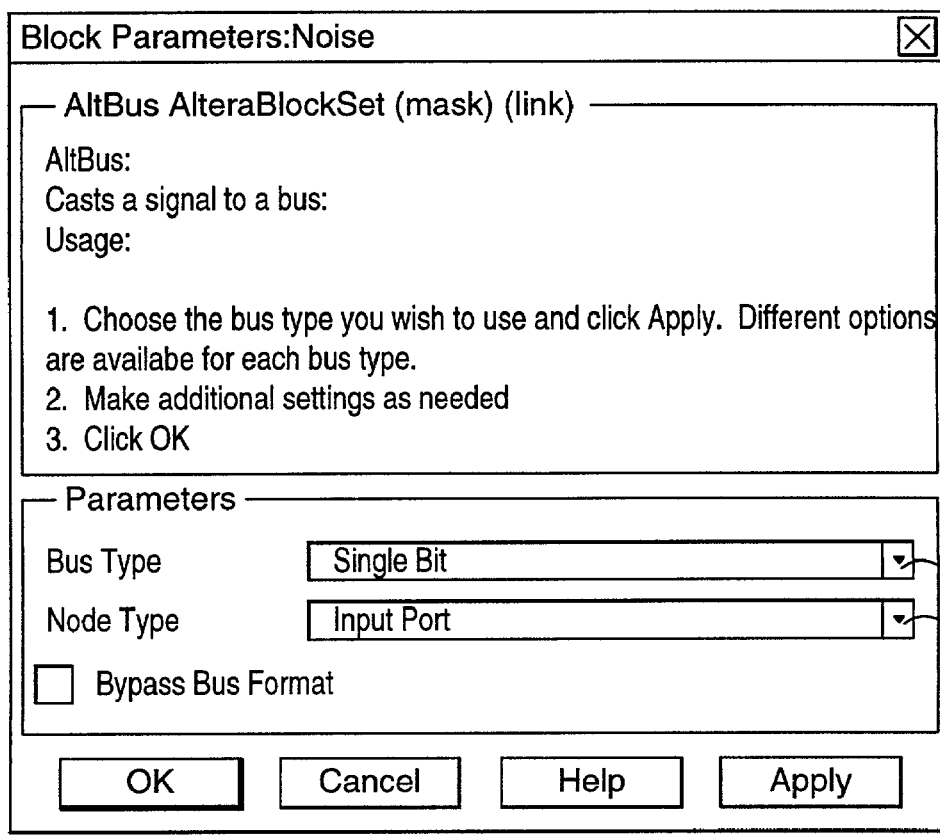
Figure 2H:
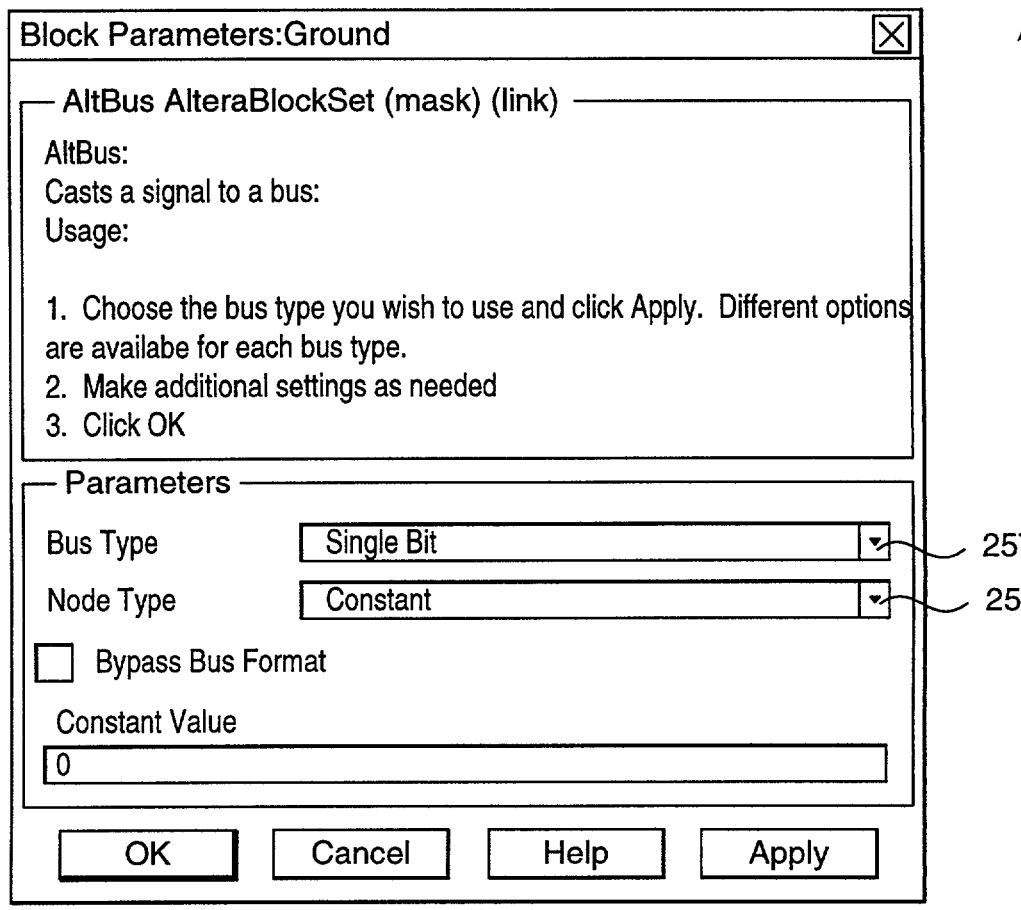

In the embodiment described at this point, parameter interface 237 is central to allowing designers to specify hardware constraints in the form of word formats for various signals in a design. As indicated, in the embodiment depicted in FIG. 1B, these constraints take the form of word format modules provided at appropriate inputs and outputs to functional blocks in a system level design. FIGS. 2F, 2G, and 2H show alternative parameterization options (in comparison to the option shown in FIG. 2E). In FIG. 2F, for example, the parameter interface 237 contains the parameters for word format module 121 of FIG. 1B. The parameter settings are identical to those shown in FIG. 2E, with the exception that the node type is specified as an output port, rather than an input port. Note that the "saturate" and "round" options are mathematical operations in fixed arithmetic on busses to control the bit width growth in operations such as adding and multiplying. When the round option is turned on, the output is rounded away from zero. When this option is turned off, the LSB is truncated: <int> (input +0.5). When the saturate option is turned on, if the output is greater than the maximum positive or negative value to be represented, the output is forced (or saturated) to the maximum positive or negative value, respectively. When this option is turned off, the MSB is truncated. The "bypass bus" option allows the simulation to take place in floating point numbers using conventional system level simulation.

FIG. 2G depicts the parameter settings for word format module 119 of FIG. 1B. In this case, the bus type parameter is set to a "single bit" value 251. And the node type parameter is set to an input port option 253. FIG. 2H shows the parameter settings for the "ground" block depicted in FIG. 1B. As illustrated in FIG. 2H, the relevant parameters include a single bit setting 257 for the bus type and a "constant" setting 259 for the node type.

Figure 2I:
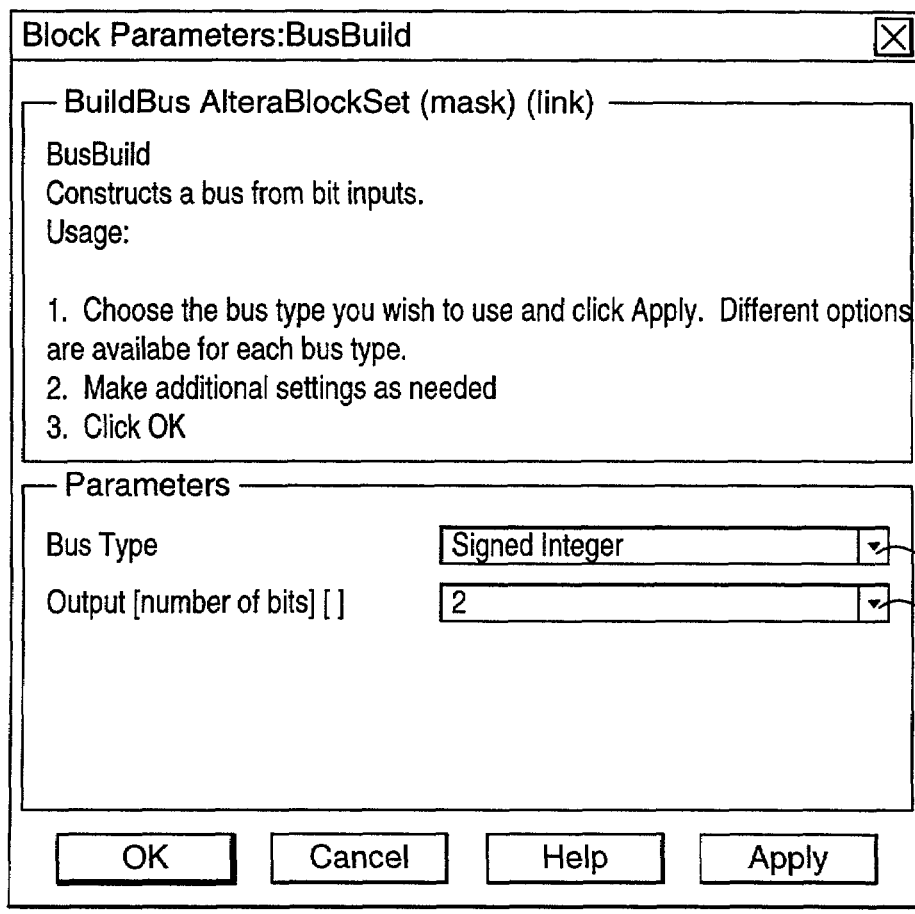
FIG. 2I is a window presented to a designer for constructing a bus from bit inputs. A designer can parameterize the bus according to a bus type and the number of bits in an output of the bus.

Note that FIG. 2C depicts in directory 217 various options under a bus manipulation folder 222. These include an AltBus (word format) option 224 and a bus build option 226. In FIGS. 2E through 2H, the AltBus option 224 was selected. For block 125, of FIG. 1B, however, the bus build option 226 is necessary. As shown in FIG. 2I, this option constructs a bus from bit inputs. In the example of FIG. 1B, these inputs are a ground input and a 1-bit noise input from random bit stream 107. FIG. 2I shows an appropriate parameter interface 261 for parameterizing a bus constructed in this manner. As illustrated, the parameters include a bus type setting 263 and an output number of bits setting 265.

As indicated above, among the parameters that a designer can set for any given design block are floorplan constraints. Examples of floorplan constraints include pin in and pin out designations, constraints on locations of particular logic or memory elements in the hardware target device, timing driven constraints, resource mapping (e.g., locations of memory versus logic cells), global buffer assignments (e.g., for clock and reset), microprocessor bus interface (avalon versus custom interface), DSP board digital I/O connector constraints such as jumper position, etc. Generally, floorplan constraints are constraints that force functional blocks to reside in or make use of particular resources available on a target hardware device. Without floorplan constraints, a compiler will position the functional blocks as it deems appropriate.

Certain off-the-shelf functional blocks, particularly more complex functional blocks such as megafunctions, allow the designer to parameterize with various floorplan constraints such as pins locations. Other functional blocks have floorplan constraints preset. By selecting such functional blocks for a hardware design, the designer effectively sets floorplan constraints while still designing the algorithm.

Figure 2J:
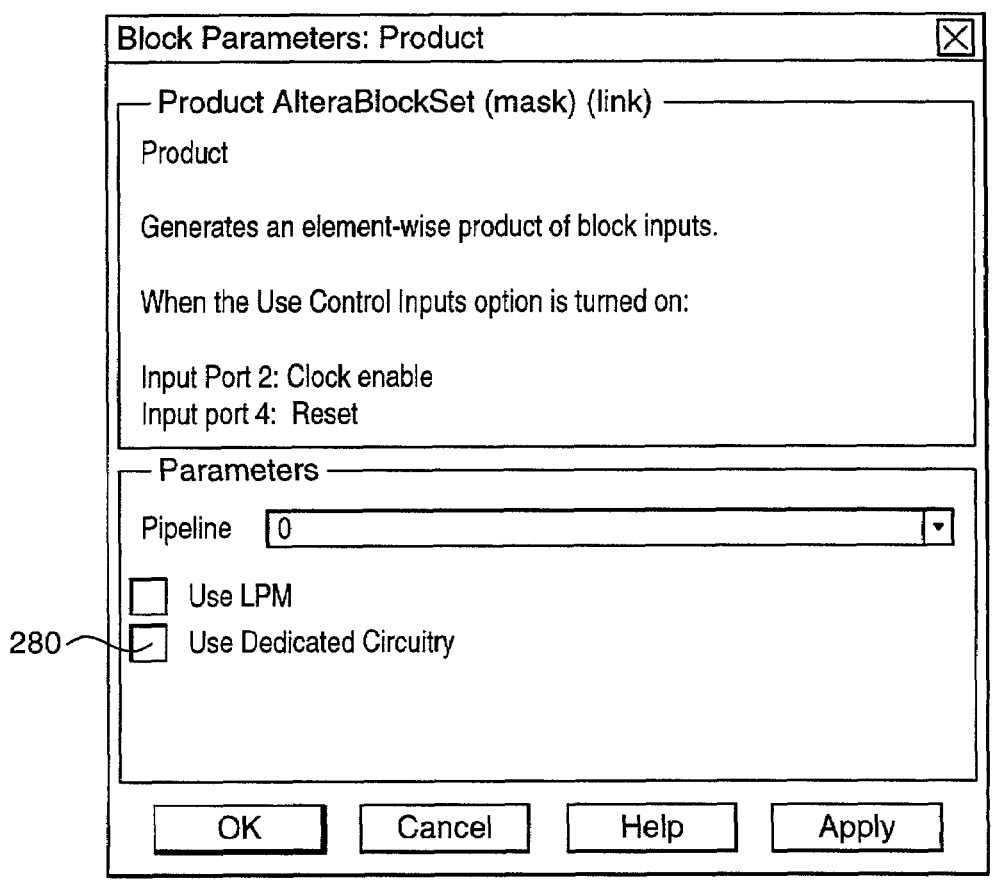
FIG. 2J is an interface window for multiplier block—used to illustrate a floorplan constraint option.

FIG. 2B (depicting the Signal Compiler block 223) includes "clock" parameters period 274 and location 276. Examples of options for the clock location include a global buffer and a PLL (not depicted). Choosing one of these over the other represents a floorplan constraint. The global buffer and the PLL represent different hardware locations on the final device. The period specification also represents a floorplan constraint, albeit indirectly. The period specifies the allowed propagation delay between two elements, and thereby constrains the hardware layout. In another example, FIG. 2J depicts a parameter interface 278 for a multiplier. As shown, there is a check box 280 labeled "Use Dedicated Circuitry." Selecting this option forces the multiplier parameterized in interface 278 to be implemented in dedicated multiplier circuitry on the target hardware device. Altera's Stratix™ devices contain logic elements, memory, and dedicated parallel multiplier circuitry (denoted DSP Blocks). Without selecting check box 280 the compiler is free to locate the multiplier of interface 278 wherever it sees fit. With check box 280 selected, the compiler is forced to locate the multiplier on the Stratix's dedicated multiplier circuitry.

Figure 3A:
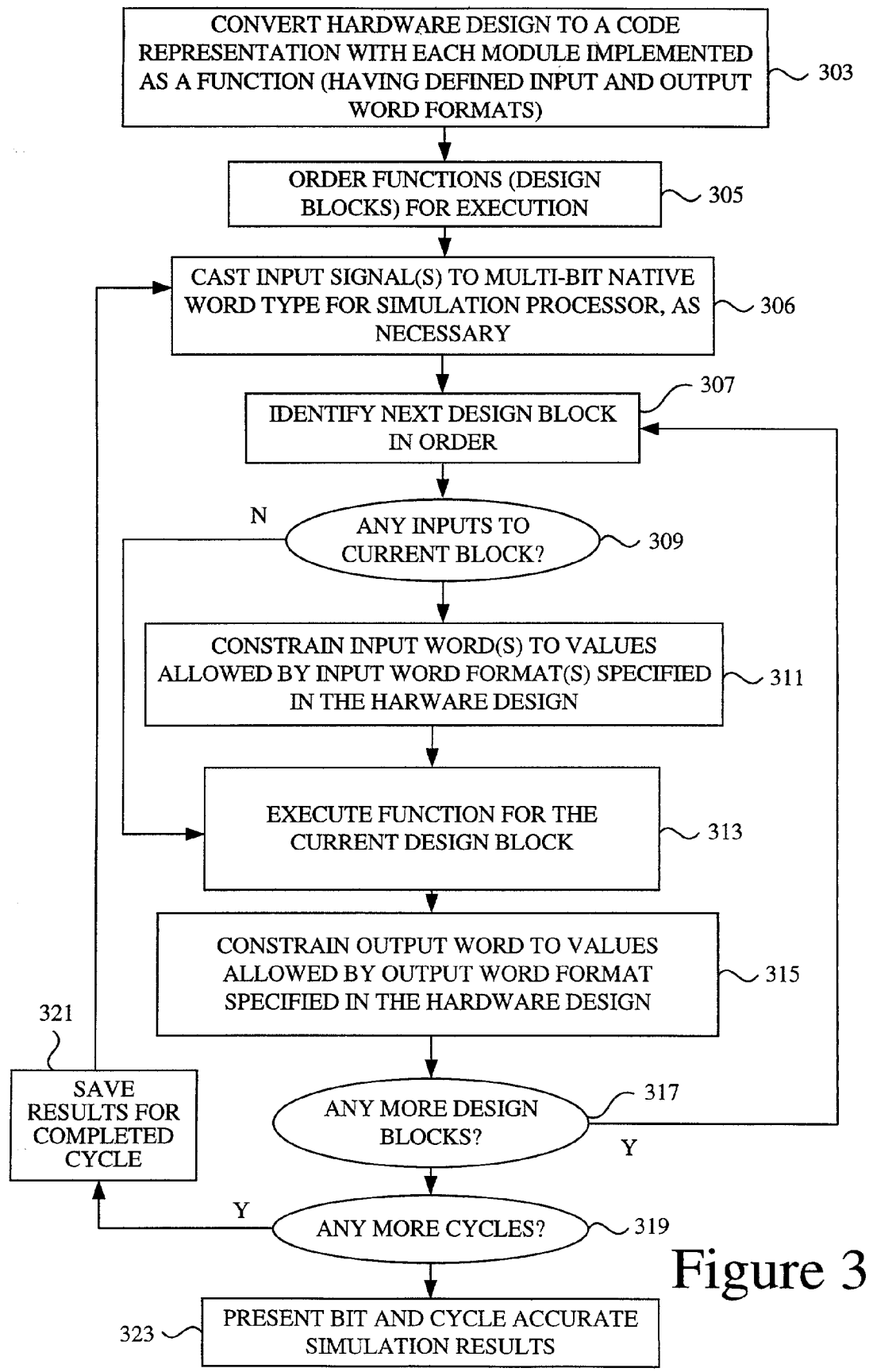
FIG. 3A is a process flow diagram of computational method for performing a bit and cycle accurate simulation of this invention.

FIG. 3A presents a process flow that may be employed to conduct the bit and cycle accurate simulation of a user's hardware design in a system level simulator. This corresponds to process block 207 of FIG. 2A. Of course, the simulation depicted in FIG. 3A is not limited to the context illustrated in FIG. 2A.

In the example of a Simulink system level simulator, the simulation process begins when the user selects a simulation button 103 depicted as an arrow in the user interface window 101 of FIG. 1B. Initially, the system level simulator translates the block representation of the hardware design together with parameter values and word format constraints to compiled code, optimized for execution of the simulation. See 303. Preferably, the code is generated in a compiled language (as opposed to an interpreted language such as Perl or Java) that provides close control of the final CPU mapping. As examples, the code language may be C/C++, Ada, etc.

Each module of the block diagram so translated becomes a "function" with its own input and outputs. Also, as part of the process of preparing for the simulation, the system level simulator orders the individual functions (design blocks) for execution during the simulation. See 305. Note that the operations 303 and 305 may be performed in a manner consistent with normal operation of Simulink or other suitable system level simulator. For the Simulink case, the general process is described in the User's Guide, Version 3, Fixed-Point Blockset (for use with Simulink), available from the MathWorks.

As depicted in FIG. 3A, the subsequent simulation process embodies two separate loops, an outer loop incremented once for each new cycle, and an inner loop incremented once for each new module considered during simulation of a single cycle. At the beginning of each cycle, the signal inputs for the simulation must conform to a multi-bit word format native to the simulation processor. Where the simulation is conducting using a floating point unit of a simulation processor, this multi-bit format is a floating point format. To the extent that the hardware design requires input signals in a non-native format, those input signals must be cast to the native format used for the simulation by the simulation processor. See block 306.

Preferably, the word format employed for the simulation is one that allows the simulation processor to operate on the whole word in a single cycle (rather on single bit portions of the word as in the prior art). In other words, the word type is chosen to allow execution by efficient multi-bit modules or units of the simulation processor. Examples of computational resources that can operate on multi-bit words in a single cycle include the Floating Point Unit (FPU) and the Arithmetic Logic Unit (ALU) of general purpose microprocessors such as the Intel Pentium processors and the Sun SPARC processors. The casting function will be described in more detail below.

Within a given cycle, the simulator must identify a sequence of design blocks as ordered at process block 305. Thus, at block 307, the simulator identifies a next design block for consideration. The coded function for that design block is evaluated to determine whether there are any inputs to the current block. See 309. If so, the input words are checked to make sure that they conform to any format constraints imposed by word format modules at the input to the design block under consideration. To the extent that an input word does not conform, it is modified as necessary to meet the constraint. See 311. For example, if the current block is a multiplier that multiplies two four bit values and each of those is a signed integer, the input signals must be integer values ranging between −8 and 7. If an input signal does not meet this constraint, it is rounded, masked, etc. as appropriate to meet the constraint. Note that this operation is performed on words meeting the native word type resulting from the operations at 306. Hence, a 64 bit floating point input word, for example, is constrained to represent integer values between −8 and 7.

After the input word or words has been constrained as necessary to meet the word format requirements of the hardware module under consideration, the system then executes the code for the current function, as depicted at 313. As indicated, the data manipulations required for this operation are performed by appropriate units of the simulation processor, typically by the Floating Point Unit.

For many hardware modules, operation 313 employs an FPU or other appropriate processor resource using full floating point words. However, for certain functions (corresponding to certain hardware modules in the design), a different processor resource may be more appropriate. For example, "bit oriented functions" such as shifts and basic logic operations (AND, NOT, etc.) may be more efficiently performed by integer processing resources in the simulation processor. Thus, in some embodiments, when the simulator encounters hardware modules that require nothing more than a simple bit oriented function, the simulator first casts the input word to an integer format (from presumably a floating point format) before executing the function. The output result, which remains in integer word format, is then cast back to floating point format before further processing.

Returning to decision 309, assuming that there are no inputs to the current block (i.e., decision 309 is answered in the negative), process control moves directly to block 313, skipping block 311. An example of such case would be execution of the "SineWave" block on the left side of user interface window 101.

After executing the code associated with the current function (design block), the processor will have computed at least one output value. As indicated, to take full advantage of the processor resources, this output value typically will be in double precision floating point or other native format. However, a bit accurate simulation requires that the output value exist in single precision fixed-point format or some other non-native (from the processor's perspective) format. Therefore, at block 315, the system level simulator constrains the native-type output word to meet the requirements imposed by hardware design. Note that these requirements are typically specified by the word format module provided on the output side of the current design block as specified by the user. For example, when the delay block function depicted in window 101 is executed, the output value must be a 16 bit signed integer format as indicated in the "Sin-Delay" bus shown in FIG. 1B.

After constraining the output word to a value meeting the requirements of the hardware design, the system determines whether there are any more design blocks to be considered during simulation of the current cycle. See decision 317. If so, process control returns to block 307 where the next design block in the design is identified for analysis. That block is identified based on the order set at process block 305. The newly selected design block is then executed to generate an output value meeting the hardware word constraints as described above. Specifically, operations 309, 311, 313, and 315 are performed as necessary.

Ultimately, all design blocks of the design will be considered and there will be no more blocks to execute. Then decision 317 will be answered in the negative, and the system level simulator will determine whether there are any more cycles to consider. See decision 319. If more cycles must be simulated, the results for the completed cycle are saved as indicated at 321 and process control returns to block 306. There, the simulator casts any input signals as necessary to the multi-bit word format employed for the simulation. Then, at 307, the system identifies the first design block from the ordered arrangement of design blocks. The process then proceeds through operations 309, 311, 313, 315, and 317 as necessary.

Ultimately, after each of the cycles of a required simulation has been completed (decision 319 is answered in the negative), the simulator presents the bit and cycle accurate simulation results as indicated at 323. As an example, see the simulation results depicted under the "scope" window on the right side of user interface window 101 of FIG. 1B. These final results are typically provided in the word format employed by the simulation processor (the multi-bit native word format).

As part of a simulation, a casting function used for this invention must convert between different word formats prior to execution of functions associated with a hardware design. Prior to execution, the casting function casts one or more non-native format input word(s) to a native format (for the simulation processor).

Certain considerations must be taken into account when designing the appropriate casting function. First, the native word type of the simulation processor must be considered. Typically, though not necessarily, native word type is a floating point word type. However, this invention can work with other native word types such as integer word types, both signed and unsigned. Obviously, a second consideration for the casting function is the native word size. In the case of a floating point word type, the word size includes not only the total number of bits but also the number of bits associated with a mantissa and an exponent. In one example, a floating point word is 64 bits in total length with a 53 bit mantissa and an 11 bit exponent. A final consideration in developing a suitable casting function involves how to make use of the available bits in a native format word. For example, if the native format word is a floating point word, then one must decide how to make use of the mantissa and exponent when casting bits representing the non-native word to the native word.

In one preferred embodiment, a non-native format word is cast into the mantissa only of the 64 bit floating point word. In this embodiment, the bits in the exponent are not used. In alternative embodiments, the exponent bits could be used to help represent the input word. For example, this could be done with a C union function between the exponent values and the mantissa values.

As an example, consider a hardware design having a 7 bit integer input word. Assume that this word format is non-native to the relevant processing components of the simulation processor, which employs a 64 bit floating point word as depicted in FIG. 3B. Assume further that the input signal to be simulated has the value 51. In decimal exponential format, this value is represented as 5.1 exp(1). In normal binary format, it is represented as 110011. In decimal exponential format, it is represented as $1.10011 \times 2^5$. In normal floating point format of a processor, as shown in the figure, the mantissa value would be 110011. (Because the "1" to the left of the decimal is redundant, it is omitted from the mantissa in the IEEE storage format.) The exponent would be 101 (5), ignoring a bias. In the integer hardware word format, this value is represented without the exponent. As depicted in FIG. 3B, to cast this non-native format word to the native floating point format, the casting function packs the exponent section of the floating point word with zeroes and packs the mantissa with bits the full binary value of 51 (110011). The simulation processor then operates on the value 110011 as constructed in the floating point format word.

FIG. 3C graphically compares the signed binary fractional, signed binary, and unsigned binary number formats that may be available with word format modules of this invention. As indicated, the word format modules cast floating-point system level simulator signals (of type double for example) into fixed-point signals. In one embodiment, the fixed-point signals may be represented in signed binary fractional (SBF) format as shown below:

[number of bits].[ ]—Represents the number of bits to the left of the binary point including the sign bit.

[ ].[number of bits]—Represents the number of bits to the right of the binary point.

In VHDL, the signals may be typed as STD_LOGIC_VECTOR defined in the IEEE library (ieee.std_logic_1164.all and ieee.std_logic_signed.all packages). For example, the 4-bit binary number 1101 is represented as follows:

System Level Simulator This signed integer is interpreted as −3

VHDL This signed STD_LOGIC_VECTOR is interpreted as −3

If designer changes the location of the binary point to 11.01, i.e., 2 bits on the left side of the binary point and two bits on the right side, the numbers are represented as follows:

System Level Simulator This signed integer is interpreted as −0.75

VHDL This signed STD_LOGIC_VECTOR is interpreted as −3

From a system-level analysis standpoint, multiplying a number by −0.75 or −3 is obviously very different, especially when looking at the bit width growth. In the one case the multiplier output bus grows on the MSB, in the other case the multiplier output bus grows on the LSB. In both cases the binary numbers are identical. However, the location of the binary point affects how a simulator formats the signal representation. In a preferred embodiment, the user can adjust the binary point location to define the signal range and the area of interest.

The use of signed binary fractional (SBF) format by word format modules (at an input or output port for example) is further illustrated in FIG. 3D. As depicted there, the same input number, 4/3 or 1.33333 in floating point, is interpreted differently in the system level simulator depending upon the position of the binary point in 5 bit words. In the case of [5].[0], the available values are integers ranging from −16 to 15. Therefore the appropriate approximation for 4/3 is 1. In the case of [2].[3], the available values range from −2 through 15/8. The appropriate approximation for 4/3 is 1.25. In the case of [1].[4], the values range from −1 through 15/16. In this case, more bits are needed to represent the integer part of the number. So the value −0.6875 is used.

Returning to FIG. 2A, block 211, a preferred embodiment of this invention allows the designer to synthesize and compile a design developed in the system level simulator without launching another application. In many commercially available systems, the designer would have to launch one or more separate applications to perform the synthesis and compile operations for converting an HDL representation of her design to a map suitable for programming a target hardware device. In the depicted embodiment, the user may employ a signal compiler block as depicted in FIG. 2B for performing the following operations: (1) converting a system level simulator representation of the design to a hardware design language representation, (2) synthesizing the HDL representation of the design, (3) compiling the synthesized design, and (4) programming the compile design onto a target hardware device. In the depicted signal compiler block 223, each of these operations is assigned to a separate button. Thus, a button 267 controls conversion of the simulator design to HDL. A button 269 controls synthesis of the HDL representation. A button 271 controls compilation of the synthesized design. And, a button 273 controls programming of the compiled design onto a target hardware device. In an alternative embodiment, the application could dispense with these various buttons and employ a single control mechanism for conversion, synthesis, compilation, and programming. Or, this all in one control mechanism can be used for in conjunction with separate control mechanisms for one or more of the four operations.

The operations of the various buttons shown in FIG. 2B bring to into play various software functions of the underlying hardware design automation software. In one widely used architecture, these functions include, in addition to the system level simulator, a synthesizer, a compiler, an HDL simulator, and a layout program. Frequently, the layout program forms part of the compiler. The system level simulator program allows the user of the system to enter and/or modify a schematic diagram of an electronic design using the display screen, generating a net list (summary of connections between components) in a Hardware Design Language HDL format. Examples of HDLs include Verilog and VHDL. The syntax of a VHDL description is described in IEEE Standard VHDL Language Reference Manual (IEEE Std 1076-1987), which is incorporated herein by reference for all purposes and in its entirety. The operation of converting the schematic design to a HDL format is controlled by button 267 depicted in the signal compiler block of FIG. 2B.

The synthesizer is a tool that automatically creates one design representation from another. Usually the mapping is from more abstract descriptions into more detailed descriptions, closer to the final form for implementation. For example, a VHDL description could be mapped into a collection of Boolean equations that preserve the behavior of the original specification, while describing the system at a greater level of detail. Frequently, a synthesizer creates a synthesized netlist from the designer's high-level electronic design. Synthesis may remove redundant gates, replace the gates of a sub-network of the design with an equivalent network of newly generated "synthesized gates" and/or otherwise convert the design into a more efficient representation. Various commercially available synthesis tools are known and widely used. One example is the LeonardoSpectrum product available from Mentor Graphics of Wilsonville, Oreg. Another example is the Synplify product available from Synplicity of Sunnyvale, Calif.

The compiler takes the net list as an input, and using a component database puts all of the information necessary for layout, verification, and simulation into an object file or files. The verifier checks the input design (HDL) for design errors, such as multiple outputs connected together, overloaded signal paths, etc. and generates error indications if any such design problems exist. The HDL simulator takes the object file(s) and simulation models, and generates a set of simulation results, acting on instructions, initial conditions, and input signal values provided to it either in the form of a file or user input.

When compilation is complete, the target hardware device is programmed with the compiled design. The portion of the compiler performing this operation is sometimes referred to as an assembler.

OTHER EMBODIMENTS

While the methods, apparatus, and computer program products of this invention are applicable to any electronic design, they find particular value in the context of programmable logic devices (PLDs). A PLD is a programmable integrated circuit that allows the user of the circuit, using software control, to customize the logic functions the circuit will perform. Examples of PLDs are FPGAs (Field Programmable Gate Arrays) and EPLDs (Erasable Programmable Logic Devices). The logic functions previously performed by small, medium and large scale integration integrated circuits can instead be performed by programmable logic devices. Programmable logic devices supplied by integrated circuit manufacturers like Altera Corporation of San Jose, Calif. (a more detailed description of these products can be found at "www.altera.com") are not inherently capable of performing any specific function. The user, in conjunction with software supplied by the PLD manufacturer, can program the PLD to perform the specific function or functions required by the user's application. The PLD then can function in a larger system designed by the user, just as though dedicated logic chips were employed.

A typical PLD consists of an array of logic cells that can be individually programmed and arbitrarily interconnected to each other to provide internal input and output signals, thus permitting the performance of highly complex combinational and sequential logic functions. The program is implemented in the PLD by setting the states of programmable elements such as memory cells. These memory cells may be implemented with volatile memories, such as SRAMs, which lose their programmed states upon termination of power to the system. If the programmable elements used are volatile memories, the memory cells must be configured upon each system power-up in order to configure the PLD.

In addition to methods, apparatus, and computer program products, this invention also relates to programmable logic devices (and other target hardware devices) programmed with a design prepared in accordance with the above-described methods.

The foregoing describes the instant invention and its presently preferred embodiments. Numerous modifications and variations in the practice of this invention are expected to occur to those skilled in the art. For instance, the techniques and systems of the present invention are suitable for use with a wide variety of EDA tools and methodologies for designing, simulating, compiling and/or programming a device. Therefore, the described embodiments should be taken as illustrative and not restrictive, and the invention should not be limited to the details given herein but should be defined by the following claims and their full scope of equivalents.

What is claimed is:

1. A method of conducting bit accurate simulation of a hardware design of a target hardware device, with the bit accurate simulation being conducted on a simulation processor, the method comprising:
    (a) receiving a parameterized representation of one or more hardware blocks comprising the hardware design, wherein the hardware blocks have inputs employing specified word formats; and
    (b) simulating operation of the hardware design by a process comprising:
        (i) casting one or more words used in the hardware design into a multi-bit native format for the simulation processor,
        (ii) for a first hardware block, constraining the value of a first input word, existing in the multi-bit native format, to meet a word format constraint imposed by the hardware design on the first input word, and
        (iii) performing an operation specified by the first hardware block on the first input word, existing in the multi-bit native format, to produce an output word.

2. The method of claim 1, wherein the simulation is executed on a floating point processing component of the simulation processor, and wherein the multi-bit native format is a floating point format.

3. The method of claim 2, wherein the simulation processor is a general purpose microprocessor.

4. The method of claim 1, wherein receiving the parameterized representation of one or more hardware blocks comprises receiving user inputs specifying said specified word formats for one or more of the hardware blocks.

5. The method of claim 4, wherein the specified word formats are specified by word format modules input by the user in the parameterized representation of the one or more hardware blocks comprising the hardware design.

6. The method of claim 1, further comprising constraining the value of the output word, existing in the multi-bit native format, to meet a word format constraint imposed by the hardware design on an output of the first hardware block.

7. The method of claim 1, wherein the at least one of the first input word and the output word is constrained to be an integer.

8. The method of claim 1, wherein the word format specifies one or more of (i) a word type, (ii) a node type, and (iii) a word size.

9. The method of claim 1, wherein the simulation is carried out in a system level simulator.

10. The method of claim 1, wherein the parameterized representation of one or more hardware blocks comprising the hardware design is received in a system level simulator.

11. The method of claim 10, further comprising compiling the hardware design in response to user instructions to compile received in the system level simulator.

12. The method of claim 10, further comprising synthesizing the hardware design in response to user instructions to synthesize received in the system level simulator.

13. The method of claim 10, further comprising:
compiling the hardware design; and
programming the compiled hardware design onto a target hardware,
wherein the compiling and programming operations are executed in response to user instructions to program received in a system level simulator, without launching another application.

14. The method of claim 10, wherein receiving the parameterized representation of one or more hardware blocks comprising the hardware design comprises:
presenting a parameter interface for a hardware block; and
receiving hardware parameters entered in the parameter interface by a user.

15. The method of claim 10, wherein receiving the parameterized representation of one or more hardware blocks comprising the hardware design comprises:
receiving a floorplan constraint for one or more of the hardware blocks;
constraining the one or more hardware blocks to conform with the floorplan constraint.

16. The method of claim 14, wherein the floorplan constraint is received from a user input to a parameter interface for a hardware block.

17. A computer program product comprising a computer readable medium on which is provided program instructions for conducting bit accurate simulation of a hardware design of a target hardware device, with the bit accurate simulation being conducted on a simulation processor having a native word format, the instructions comprising:
(a) receiving a parameterized representation of one or more hardware comprising the hardware design, wherein the hardware blocks have inputs employing specified word formats; and
(b) simulating operation of the hardware design by a process comprising:
(i) casting one or more words used in the hardware design into a multi-bit native format for the simulation processor,
(ii) for a first hardware block, constraining the value of a first input word, existing in the multi-bit native format, to meet a word format constraint imposed by the hardware design on the first input word, and (iii) performing an operation specified by the first hardware block on the first input word, existing in the multi-bit native format, to produce an output word.

18. The computer program product of claim 17, wherein the simulation is executed on a floating point processing component of the simulation processor, and wherein the multi-bit native format is a floating, point format.

19. The computer program product of claim 17, wherein receiving the parameterized representation of one or more hardware blocks comprises receiving user inputs specifying said specified word formats for one or more of the hardware blocks.

20. The computer program product of claim 19, wherein the specified word formats are specified by word format modules input by the user in the parameterized representation of the one or more hardware blocks comprising the hardware design.

21. The computer program product of claim 17, wherein the simulation operation further comprises constraining the value of the output word, existing in the multi-bit native format, to meet a word format constraint imposed by the hardware design on an output of the first hardware block.

22. The computer program product of claim 17, wherein the at least one of the first input word and the output word is constrained to be an integer.

23. The computer program product of claim 17, wherein the word format specifies one or more of (i) a word type, (ii) a node type, and (iii) a word size.

24. The computer program product of claim 17, further comprising instructions for presenting a system level simulator, and wherein the parameterized representation of one or more hardware blocks comprising the hardware design is received in the system level simulator.

25. The computer program product of claim 24, further comprising instructions for:
compiling the hardware design; and
programming the compiled hardware design onto a target hardware,
wherein the compiling and programming operations are executed in response to user instructions to program received in a system level simulator, without launching another application.

26. The computer program product of claim 24, wherein the instructions for receiving the parameterized representation of one or more hardware blocks comprising the hardware design comprise instructions for:
receiving a floorplan constraint for one or more of the hardware blocks;
constraining the one or more hardware blocks to conform with the floorplan constraint.

27. The computer program product of claim 26, wherein the floorplan constraint is received from a user input to a parameter interface for a hardware block.

28. A method of conducting bit accurate simulation of a hardware design of a target hardware device, with the bit accurate simulation being conducted on a simulation processor, the method comprising:
(a) presenting a system level simulator;
(b) receiving, in the system level simulator, a parameterized representation of one or more hardware blocks comprising the hardware design, wherein the hardware blocks have inputs employing specified word formats; and
(c) simulating operation of the hardware design in the system level simulator by a process comprising:

(i) casting at least one input word, having a first word format specified by the hardware design into a multi-bit native format for the simulation processor, (ii) performing an operation specified by a first hardware block on a first input word cast in the multi-bit native format to produce an output word in the multi-bit native format, and (iii) constraining the value of the output in the multi-bit native format to meet a word format constraint imposed by the hardware design on the output word.

29. A bit accurate simulator for use with a system level simulator, the bit accurate simulator comprising a computer readable medium and program code thereon for performing operations comprising:

(a) providing a representation of a hardware design of a target hardware device comprised of hardware blocks in the system level simulator, wherein the hardware blocks employ word formats, which are a non-native word formats for a simulation processor, and wherein the hardware design comprises a first hardware block having a first input and word format constraint imposed on said first input;

(b) casting a simulation input signal to a multi-bit native format for the simulation processor;

(c) constraining the value of the first input, while cast in the multi-bit native format, to meet word format constraint imposed by the hardware design on the first input; and (d) performing an operation specified by the first hardware block on the first input cast in the native format to produce an output in the native format, wherein the operation is performed using the simulation processor.

30. The bit accurate simulator of claim 29, wherein the program code further encodes the following operation:

(e) constraining the value of the output in the native format to produce an output word having a second word format specified in the hardware design.

31. The bit accurate simulator of claim 29, wherein the multi-bit native format is a floating point format and the word format requirements imposed by the hardware design on the first word comprises a fixed point format requirement.

32. An apparatus for conducting bit accurate simulation of a hardware design of a target hardware device the apparatus comprising:

(a) a simulation processor;

(b) data representing the hardware design, including (i) one or more parameterized hardware blocks and (ii) word format modules constraining word formats of inputs and outputs to at least some of the one or more parameterized hardware blocks;

(c) a display for presenting an image of the hardware design, depicting the one or more parameterized hardware blocks and word format modules; and (d) instructions for executing said bit accurate simulation on the simulation processor, wherein the instructions comprise:

(i) casting one or more words used in the hardware design into a multi-bit native format for the simulation processor, (ii) for a first hardware block, constraining the value of a first input word, existing in the multi-bit native format, to meet a word format constraint imposed by the hardware design on the first input word, and (iii) performing an operation specified by the first hardware block on the first input word, existing in the multi-bit native format, to produce an output word.

33. The apparatus of claim 32, wherein the multi-bit native format is a floating point format.

34. The apparatus of claim 32, wherein the simulation processor is a general purpose microprocessor having a floating point unit.

35. The apparatus of claim 32, further comprising a user interface for receiving user inputs specifying said specified word formats for one or more of the hardware blocks.

36. The apparatus of claim 32, further comprising instructions for constraining the value of the output word, existing in the multi-bit native format, to meet a word format constraint imposed by the hardware design on an output of the first hardware block.

37. The apparatus of claim 32, wherein the word format specifies one or more of (i) a word type, (ii) a node type, and (iii) a word size.

38. The apparatus of claim 32, further comprising instructions for presenting a system level simulator via a user interface for displaying the parameterized representation of one or more hardware blocks comprising the hardware design.

* * * * *